(12) United States Patent
Masuda (10) Patent No.: US 8,847,704 B2
(45) Date of Patent: Sep. 30, 2014

(54) ELECTRONIC COMPONENT (71) Applicant: Murata Manufacturing Co., Ltd., Nagaokakyo (JP)

(72) Inventor: Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/802,881

(22) Filed: Mar. 14, 2013

(65) Prior Publication Data

US 2013/0194056 A1    Aug. 1, 2013

Related U.S. Application Data (63) Continuation of application No. PCT/JP2012/057485, filed on Mar. 23, 2012.

(30) Foreign Application Priority Data

Mar. 25, 2011   (JP) .................. 2011-066984

(51) Int. Cl.
H03H 7/09     (2006.01)
H03H 7/01     (2006.01)
H03H 1/00     (2006.01)

(52) U.S. Cl.
CPC .......... *H03H 7/0115* (2013.01); *H03H 7/0161* (2013.01); *H03H 7/1775* (2013.01); *H03H 2001/0085* (2013.01); *H03H 7/09* (2013.01)
USPC ....................................................... 333/175

(58) Field of Classification Search
CPC ................... H03H 7/1775; H03H 7/09; H03H 2001/0085; H03H 7/0115; H03H 7/0161
USPC .................. 333/204, 205, 185, 175, 176, 168
See application file for complete search history.

(56) References Cited

U.S. PATENT DOCUMENTS

| 5,985,414 | A | 11/1999 | Fukuda et al. | |
| 6,222,427 | B1 | 4/2001 | Kato et al. | |
| 6,307,440 | B1 | 10/2001 | Shimanuki | |
| 2007/0241839 | A1* | 10/2007 | Taniguchi | 333/185 |
| 2010/0171568 | A1* | 7/2010 | Taniguchi | 333/176 |
| 2010/0283557 | A1 | 11/2010 | Taniguchi | |
| 2012/0249264 | A1* | 10/2012 | Wakata et al. | 333/185 |
| 2013/0241672 | A1* | 9/2013 | Tamaru et al. | 333/175 |

FOREIGN PATENT DOCUMENTS

| EP | 1 398 844 A1 | 3/2004 |
| JP | 09-035936 A | 2/1997 |
| JP | 10-092691 A | 4/1998 |
| JP | 2000-278042 A | 10/2000 |

(Continued)

OTHER PUBLICATIONS

Official Communication issued in International Patent Application No. PCT/JP2012/057485, mailed on Jun. 26, 2012.

*Primary Examiner* — Benny Lee
*Assistant Examiner* — Gerald Stevens
(74) *Attorney, Agent, or Firm* — Keating & Bennett, LLP (57) ABSTRACT In an electronic component, a laminated body includes a plurality of insulator layers laminated on each other. First, second and third LC parallel resonators are loop-shaped LC parallel resonators that include via hole conductors extending in a z-axis direction and conductor layers provided on the insulator layers, and define a band pass filter. Loop planes of the first and third LC parallel resonators and a loop plane of the second LC parallel resonator are parallel to the z-axis direction and not parallel to each other.

22 Claims, 4 Drawing Sheets

(56) References Cited

FOREIGN PATENT DOCUMENTS

| | | |
|---|---|---|
| JP | 2004-104588 A | 4/2004 |
| JP | 2007-325047 A | 12/2007 |
| JP | 2011-166620 A | 8/2011 |
| WO | 2007/119356 A1 | 10/2007 |
| WO | 2009/142113 A1 | 11/2009 |

* cited by examiner

ELECTRONIC COMPONENT

BACKGROUND OF THE INVENTION

1. Field of the Invention

The present invention relates to an electronic component, and in particular, relates to an electronic component that includes a band pass filter including a plurality of LC parallel resonators.

2. Description of the Related Art

As an electronic component of the related art, for example, there has been known a laminated band pass filter described in International Publication Pamphlet No. WO 2007/119356. The laminated band pass filter includes a laminated body and a plurality of LC parallel resonators. The laminated body is configured by a plurality of dielectric layers laminated on each other. Each LC parallel resonator is configured to include a capacitor electrode and an inductor electrode. The inductor electrode is formed in a loop shape. In addition, the loop planes of the individual LC parallel resonators overlap with each other. In such a laminated band pass filter as described above, since the loop planes overlap with each other, it may be possible to increase the degree of coupling between the inductor electrodes of adjacent LC parallel resonators, and it may be possible to achieve a wider bandwidth.

Incidentally, in some cases, in an electronic component that includes a band pass filter including a plurality of LC parallel resonators, it is desirable that the degree of coupling between the inductor electrodes of the LC parallel resonators is decreased so as to obtain desired characteristics. In the laminated band pass filter described in International Publication Pamphlet No. WO 2007/119356, as a method for decreasing the degree of coupling between adjacent LC parallel resonators, to increase a distance between LC parallel resonators may be cited. However, when the distance between the LC parallel resonators is increased, a problem occurs where a laminated band pass filter grows in size.

SUMMARY OF THE INVENTION

Therefore, preferred embodiments of the present invention provide an electronic component capable of decreasing the degree of coupling between coils without an element increasing in size.

An electronic component according to a preferred embodiment of the present invention includes a laminated body including a plurality of insulator layers laminated on each other, and a first LC parallel resonator and a second LC parallel resonator that are loop-shaped LC parallel resonators including via hole conductors extending in a lamination direction and conductor layers provided on the insulator layers and define a band pass filter, wherein a first loop plane of the first LC parallel resonator and a second loop plane of the second LC parallel resonator are parallel to the lamination direction and not parallel to each other.

According to various preferred embodiments of the present invention, it is possible to adjust the degree of coupling between the coils of LC parallel resonators without an element increasing in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electronic components according to preferred embodiments of the present invention will be described.

Figure 1:
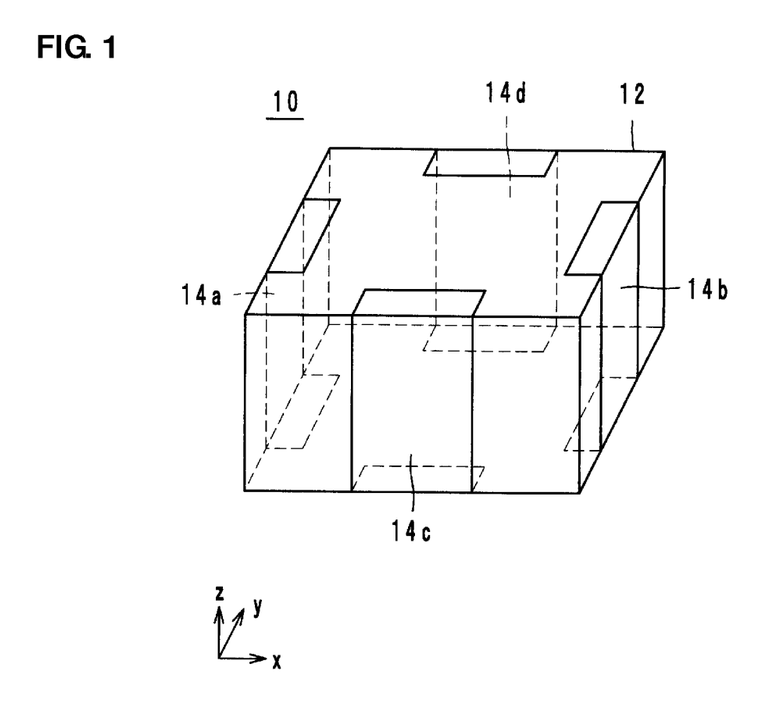
FIG. 1 is a perspective view of an electronic component according to a preferred embodiment of the present invention.
Figure 2:
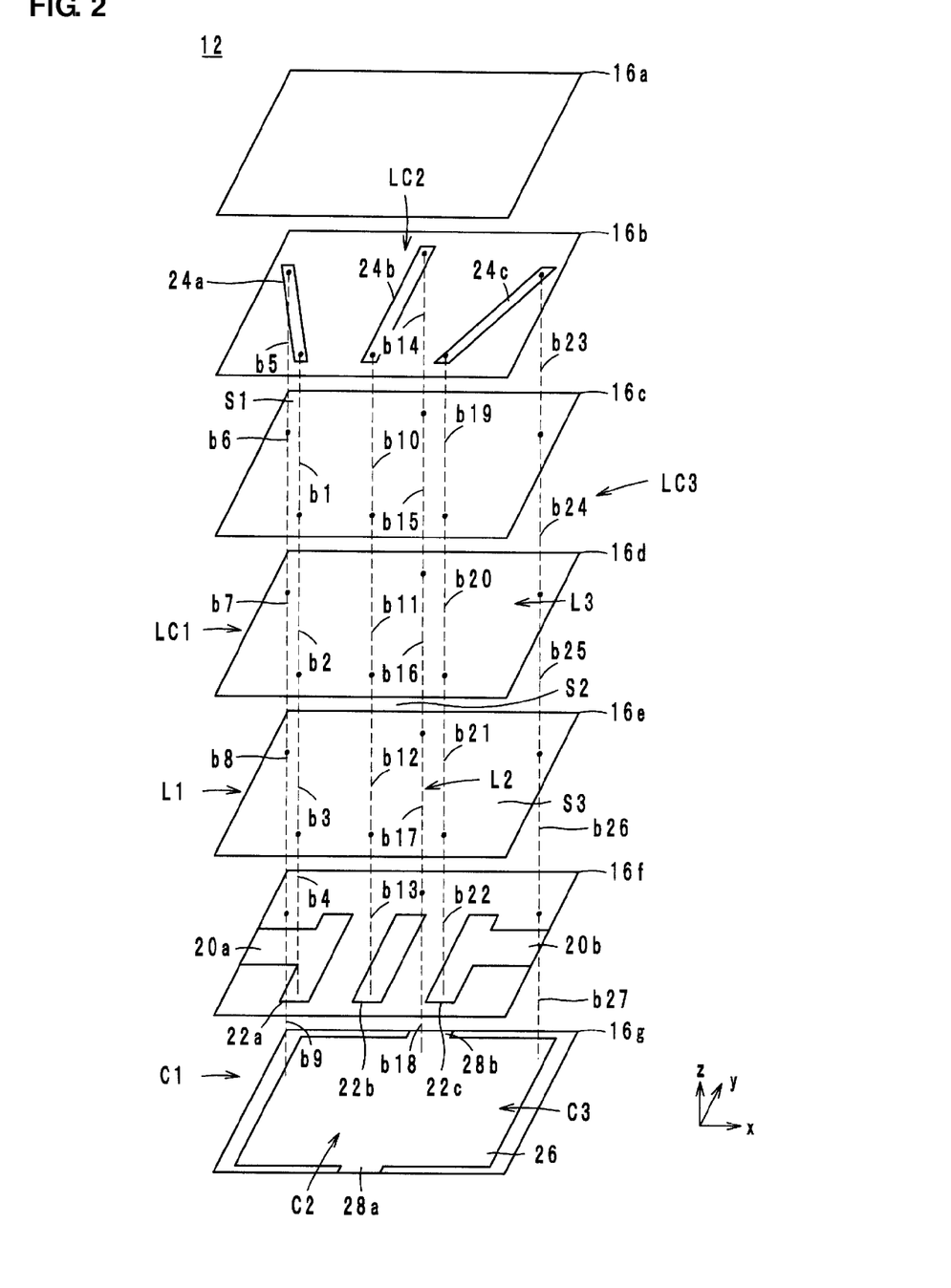
FIG. 2 is an exploded perspective view of a laminated body of an electronic component.
Figure 3:
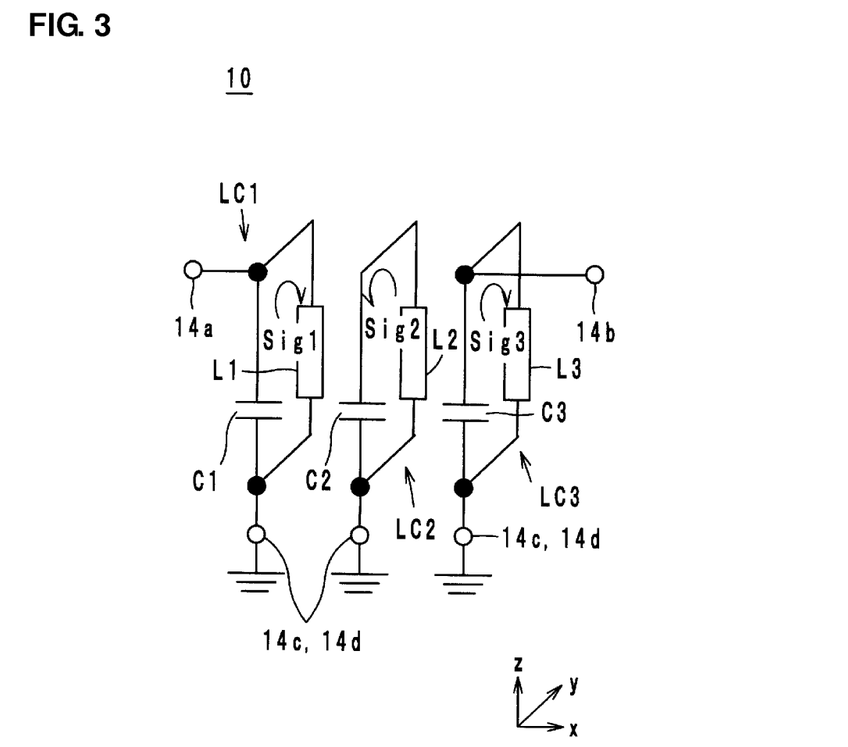
FIG. 3 is an equivalent circuit diagram of an electronic component.

Hereinafter, the configuration of electronic components according to preferred embodiments of the present invention will be described with reference to drawings. FIG. 1 is a perspective view of an electronic component 10 according to a preferred embodiment of the present invention. FIG. 2 is an exploded perspective view of a laminated body 12 of the electronic component 10. FIG. 3 is an equivalent circuit diagram of the electronic component 10. In FIG. 1 and FIG. 2, a z-axis direction indicates a lamination direction. In addition, an x-axis direction indicates a direction along the long side of the electronic component, and a y-axis direction indicates a direction along the short side of the electronic component 10.

As illustrated in FIG. 1 and FIG. 2, the electronic component 10 includes the laminated body 12, outer electrodes 14 (14a to 14d), LC parallel resonators LC1 to LC3, and extraction conductor layers 20 (20a, 20b) and 28 (28a, 28b).

As illustrated in FIG. 2, by insulator layers 16 (16a to 16g) which include ceramic dielectrics being laminated, the laminated body 12 is provided, and preferably has a rectangular or substantially parallelepiped shape. In addition, the laminated body 12 includes therein the LC parallel resonators LC1 to LC3.

As illustrated in FIG. 1, the outer electrode 14a is provided in a side surface on a negative direction side in the x-axis direction, and used as an input electrode. The outer electrode 14b is provided in a side surface on a positive direction side in the x-axis direction, and used as an output electrode. The outer electrode 14c is provided in a side surface on a negative direction side in the y-axis direction, and used as a ground electrode. The outer electrode 14d is provided in a side surface on a positive direction side in the y-axis direction, and used as a ground electrode.

As illustrated in FIG. 2, the insulator layers 16 have rectangular or substantially rectangular shapes, and are configured using, for example, ceramic dielectrics. The insulator layers 16a to 16g are laminated so as to be arranged in this order in the z-axis direction. Hereinafter, a surface of the insulator layer 16, located on the positive direction side in the z-axis direction, is referred to as a front surface, and a surface of the insulator layer 16, located on the negative direction side in the z-axis direction, is referred to as a back surface.

The LC parallel resonator LC1 includes a coil L1 and a capacitor C1. In more detail, the LC parallel resonator LC1 includes via hole conductors b1 to b9, a capacitor conductor layer 22a, a coil conductor layer 24a, and a ground conductor layer 26, and has a loop shape.

The capacitor C1 is preferably defined by the capacitor conductor layer 22a and the ground conductor layer 26. The ground conductor layer 26 is a conductor layer provided on the most negative direction side of the LC parallel resonator LC1 in the z-axis direction, and provided on the front surface of the insulator layer 16g. The ground conductor layer 26 preferably has a rectangular or substantially rectangular shape, and covers substantially the entire surface of the insulator layer 16g. The capacitor conductor layer 22a is a conductor layer facing the ground conductor layer 26 through the insulator layer 16f, and provided on the front surface of the insulator layer 16f. Accordingly, electrostatic capacity occurs between the capacitor conductor layer 22a and the ground conductor layer 26. The capacitor conductor layer 22a preferably has a rectangular or substantially rectangular shape having a longitudinal direction in the y-axis direction, and is provided on the negative direction side in the x-axis direction, compared with the point of intersection between the diagonal lines of the insulator layer 16f.

The coil L1 preferably includes the via hole conductors b1 to b9 and the coil conductor layer 24a. The via hole conductors b1 to b4 individually penetrate the insulator layers 16b to 16e in the z-axis direction. In addition, the end portion of the via hole conductor b4, located on the negative direction side in the z-axis direction, is connected to the capacitor conductor layer 22a. Accordingly, the via hole conductors b1 to b4 define one via hole conductor being connected to the capacitor conductor layer 22a and extending in the z-axis direction. The via hole conductors b5 to b9 individually penetrate the insulator layers 16b to 16f in the z-axis direction, and are provided on the positive direction side in the y-axis direction, compared with the via hole conductors b1 to b4. In addition, the end portion of the via hole conductor b9, located on the negative direction side in the z-axis direction, is connected to the ground conductor layer 26. Accordingly, the via hole conductors b5 to b9 define one via hole conductor being connected to the ground conductor layer 26 and extending in the z-axis direction.

The coil conductor layer 24a is a conductor layer provided on the most positive direction side of the LC parallel resonator LC1 in the z-axis direction, and provided on the front surface of the insulator layer 16b. The coil conductor layer 24a has a line shape inclined with respect to the y-axis so as to extend to the negative direction side in the x-axis direction while extending to the positive direction side in the y-axis direction, and is provided on the negative direction side in the x-axis direction, compared with the point of intersection between the diagonal lines of the insulator layer 16b. In addition, the coil conductor layer 24a is connected to the end portion of the one via hole conductor including the via hole conductors b1 to b4, the end portion being located on the positive direction side in the z-axis direction, and the end portion of the one via hole conductor including the via hole conductors b5 to b9, the end portion being located on the positive direction side in the z-axis direction. In other words, the end portion of the via hole conductor b1, located on the positive direction side in the z-axis direction, is connected to the end portion of the coil conductor layer 24a, located on the negative direction side in the y-axis direction. The end portion of the via hole conductor b5, located on the positive direction side in the z-axis direction, is connected to the end portion of the coil conductor layer 24a, located on the positive direction side in the y-axis direction.

In this way, the coil L1 has a U-shaped or substantially U-shaped configuration including one end that is a connection point between the via hole conductor b4 and the capacitor conductor layer 22a, and another end that corresponds to a connection point between the via hole conductor b9 and the ground conductor layer 26, and which passes through the via hole conductors b1 to b4, the coil conductor layer 24a, and the via hole conductors b5 to b9.

The LC parallel resonator LC1 configured in such a way as described above defines a loop plane S1. The loop plane S1 is a virtual plane surface having a rectangular or substantially rectangular shape, and is defined by being surrounded by the LC parallel resonator LC1. The loop plane S1 is parallel to the z-axis direction and inclined with respect to the y-axis so as to extend to the negative direction side in the x-axis direction and extend to the positive direction side in the y-axis direction.

The LC parallel resonator LC2 includes a coil L2 and a capacitor C2. In more detail, the LC parallel resonator LC2 includes via hole conductors b10 to b18, a capacitor conductor layer 22b, a coil conductor layer 24b, and a ground conductor layer 26, and has a loop shape.

The capacitor C2 is defined by the capacitor conductor layer 22b and the ground conductor layer 26. The ground conductor layer 26 is a conductor layer provided on the most negative direction side of the LC parallel resonator LC2 in the z-axis direction, and provided on the front surface of the insulator layer 16g. The ground conductor layer 26 preferably has a rectangular or substantially rectangular shape, and covers the substantially entire surface of the insulator layer 16g. In other words, the ground conductor layer 26 of the capacitor C2 is shared with the ground conductor layer 26 of the capacitor C1, and provided on the same front surface of the insulator layer 16g. The capacitor conductor layer 22b is a conductor layer facing the ground conductor layer 26 through the insulator layer 16f, and provided on the front surface of the insulator layer 16f. Accordingly, electrostatic capacity occurs between the capacitor conductor layer 22b and the ground conductor layer 26. The capacitor conductor layer 22b preferably has a rectangular or substantially rectangular shape having a longitudinal direction in the y-axis direction, and is provided on the point of intersection between the diagonal lines of the insulator layer 16f.

The coil L2 is defined by the via hole conductors b10 to b18 and the coil conductor layer 24b. The via hole conductors b10 to b13 individually penetrate the insulator layers 16b to 16e in the z-axis direction. In addition, the end portion of the via hole conductor b13, located on the negative direction side in the z-axis direction, is connected to the capacitor conductor layer 22b. Accordingly, the via hole conductors b10 to b13 define one via hole conductor being connected to the capacitor conductor layer 22b and extending in the z-axis direction. The via hole conductors b14 to b18 individually penetrate the insulator layers 16b to 16f in the z-axis direction, and are provided on the positive direction side in the y-axis direction, compared with the via hole conductors b10 to b13. In addition, the end portion of the via hole conductor b18, located on the negative direction side in the z-axis direction, is connected to the ground conductor layer 26. Accordingly, the via hole conductors b14 to b18 define one via hole conductor being connected to the ground conductor layer 26 and extending in the z-axis direction.

The coil conductor layer 24b is a conductor layer provided on the most positive direction side of the LC parallel resonator LC2 in the z-axis direction, and provided on the front surface of the insulator layer 16b. The coil conductor layer 24b has a line shape extending in the y-axis direction, and is provided on the point of intersection between the diagonal lines of the insulator layer 16b. In addition, the coil conductor layer 24b is connected to the end portion of the one via hole conductor including the via hole conductors b10 to b13, the end portion being located on the positive direction side in the z-axis direction, and the end portion of the one via hole conductor including the via hole conductors b14 to b18, the end portion being located on the positive direction side in the z-axis direction. In other words, the end portion of the via hole conductor b10, located on the positive direction side in the z-axis direction, is connected to the end portion of the coil conductor layer 24b, located on the negative direction side in the y-axis direction. The end portion of the via hole conductor b14, located on the positive direction side in the z-axis direction, is connected to the end portion of the coil conductor layer 24b, located on the positive direction side in the y-axis direction.

In this way, the coil L2 has a U-shaped or substantially U-shaped configuration including one end that is a connection point between the via hole conductor b13 and the capacitor conductor layer 22b, and another end that corresponds to a connection point between the via hole conductor b18 and the ground conductor layer 26, and which passes through the via hole conductors b10 to b13, the coil conductor layer 24b, and the via hole conductors b14 to b18.

The LC parallel resonator LC2 configured in such a way as described above defines a loop plane S2 parallel to a y-z plane (namely, parallel to the z-axis direction). The loop plane S2 is a virtual plane surface having a rectangular or substantially rectangular shape, and is defined by being surrounded by the LC parallel resonator LC2. In a planar view in the z-axis direction, the loop plane S2 is parallel to the short side of the laminated body 12 (namely, the y-axis direction).

The LC parallel resonator LC3 includes a coil L3 and a capacitor C3. In more detail, the LC parallel resonator LC3 includes via hole conductors b19 to b27, a capacitor conductor layer 22c, a coil conductor layer 24c, and a ground conductor layer 26, and has a loop shape.

The capacitor C3 is defined by the capacitor conductor layer 22c and the ground conductor layer 26. The ground conductor layer 26 is a conductor layer provided on the most negative direction side of the LC parallel resonator LC3 in the z-axis direction, and provided on the front surface of the insulator layer 16g. The ground conductor layer 26 has a rectangular or substantially rectangular shape, and covers the substantially entire surface of the insulator layer 16g. In other words, the ground conductor layer 26 of the capacitor C3 is shared with the ground conductor layers 26 of the capacitors C1 and C2, and provided on the same front surface of the insulator layer 16g. The capacitor conductor layer 22c is a conductor layer facing the ground conductor layer 26 through the insulator layer 16f, and provided on the front surface of the insulator layer 16f. Accordingly, electrostatic capacity occurs between the capacitor conductor layer 22c and the ground conductor layer 26. The capacitor conductor layer 22c has a rectangular or substantially rectangular shape having a longitudinal direction in the y-axis direction, and is provided on the positive direction side in the x-axis direction, compared with the point of intersection between the diagonal lines of the insulator layer 16f.

The coil L3 is defined by the via hole conductors b19 to b27 and the coil conductor layer 24c. The via hole conductors b19 to b22 individually penetrate the insulator layers 16b to 16e in the z-axis direction. In addition, the end portion of the via hole conductor b22, located on the negative direction side in the z-axis direction, is connected to the capacitor conductor layer 22c. Accordingly, the via hole conductors b19 to b22 define one via hole conductor being connected to the capacitor conductor layer 22c and extending in the z-axis direction. The via hole conductors b23 to b27 individually penetrate the insulator layers 16b to 16f in the z-axis direction, and are provided on the positive direction side in the y-axis direction, compared with the via hole conductors b19 to b22. In addition, the end portion of the via hole conductor b27, located on the negative direction side in the z-axis direction, is connected to the ground conductor layer 26. Accordingly, the via hole conductors b23 to b27 define one via hole conductor being connected to the ground conductor layer 26 and extending in the z-axis direction.

The coil conductor layer 24c is a conductor layer provided on the most positive direction side of the LC parallel resonator LC3 in the z-axis direction, and provided on the front surface of the insulator layer 16b. The coil conductor layer 24c has a line shape inclined with respect to the y-axis so as to extend to the positive direction side in the x-axis direction and extend to the positive direction side in the y-axis direction, and is provided on the positive direction side in the x-axis direction, compared with the point of intersection between the diagonal lines of the insulator layer 16b. In addition, the coil conductor layer 24c is connected to the end portion of the one via hole conductor including the via hole conductors b19 to b22, the end portion being located on the positive direction side in the z-axis direction, and the end portion of the one via hole conductor including the via hole conductors b23 to b27, the end portion being located on the positive direction side in the z-axis direction. In other words, the end portion of the via hole conductor b19, located on the positive direction side in the z-axis direction, is connected to the end portion of the coil conductor layer 24c, located on the negative direction side in the y-axis direction. The end portion of the via hole conductor b23, located on the positive direction side in the z-axis direction, is connected to the end portion of the coil conductor layer 24c, located on the positive direction side in the y-axis direction.

In this way, the coil L3 has a U-shaped or substantially U-shaped configuration including one end that is a connection point between the via hole conductor b22 and the capacitor conductor layer 22c, and another end corresponds to a connection point between the via hole conductor b27 and the ground conductor layer 26, and which passes through the via hole conductors b19 to b22, the coil conductor layer 24c, and the via hole conductors b23 to b27.

The LC parallel resonator LC3 configured in such a way as described above defines a loop plane S3. The loop plane S3 is a virtual plane surface having a rectangular or substantially rectangular shape, and is defined by being surrounded by the LC parallel resonator LC3. The loop plane S3 is parallel to the z-axis direction and inclined with respect to the y-axis so as to go to the positive direction side in the x-axis direction with going to the positive direction side in the y-axis direction.

As described above, in a planar view in the x-axis direction (namely, the normal direction of the loop plane S1), at least portions of the loop planes S1 to S3 of the LC parallel resonators LC1 to LC3 overlap with one another. In addition, the loop plane S1 and the loop plane S3 sandwich therebetween the loop plane S2. Accordingly, as illustrated in FIG. 3, the coil L1 in the LC parallel resonator LC1 and the coil L2 in the LC parallel resonator LC2 are electromagnetic-field-coupled to each other. In addition, the coil L2 of the LC parallel resonator LC2 and the coil L3 of the LC parallel resonator LC3 are electromagnetic-field-coupled to each other. In this regard, however, the loop planes S1, S2, and S3 are not parallel to one another. Specifically, in a planar view from the positive direction side in the z-axis direction, distances between the loop planes S1 and S3 and the loop plane S2 in end portions on the negative direction side in the y-axis direction are smaller than distances between the loop planes S1 and S3 and the loop plane S2 in end portions on the positive direction side in the y-axis direction. In a planar view from the positive direction side in the z-axis direction, the loop planes S1 and S3 are arranged so as to be line-symmetric with respect to the loop plane S2. The LC parallel resonators LC1 to LC3 configured in such a way as described above define a band pass filter.

The extraction conductor layer 20a is provided on the front surface of the insulator layer 16f, connected to the capacitor conductor layer 22a, and extracted to the short side of the insulator layer 16f, located on the negative direction side in the x-axis direction. Accordingly, the extraction conductor layer 20a is connected to the outer electrode 14a. As a result, the LC parallel resonator LC1 is electrically connected to the outer electrode 14a, between the capacitor C1 and the coil L1.

The extraction conductor layer 20b is provided on the front surface of the insulator layer 16f, connected to the capacitor conductor layer 22c, and extracted to the short side of the insulator layer 16f, located on the positive direction side in the x-axis direction. Accordingly, the extraction conductor layer 20b is connected to the outer electrode 14b. As a result, the LC parallel resonator LC3 is electrically connected to the outer electrode 14b, between the capacitor C3 and the coil L3.

The extraction conductor layer 28a is provided on the front surface of the insulator layer 16g, connected to the ground conductor layer 26, and extracted to the long side of the insulator layer 16g, located on the negative direction side in the y-axis direction. Accordingly, the extraction conductor layer 28a is connected to the outer electrode 14c. As a result, the LC parallel resonators LC1 to LC3 are electrically connected to the outer electrode 14c, between the capacitors C1 to C3 and the coils L1 to L3, respectively.

The extraction conductor layer 28b is provided on the front surface of the insulator layer 16g, connected to the ground conductor layer 26, and extracted to the long side of the insulator layer 16g, located on the positive direction side in the y-axis direction. Accordingly, the extraction conductor layer 28b is connected to the outer electrode 14d. As a result, the LC parallel resonators LC1 to LC3 are electrically connected to the outer electrode 14d, between the capacitors C1 to C3 and the coils L1 to L3, respectively.

Next, an example of the operation of the electronic component 10 will be described with reference to FIG. 1 to FIG. 3. For example, when having been input from the outer electrode 14a, a high-frequency signal Sig1 having a positive voltage flows in a clockwise fashion in a planar view from the positive direction side in the x-axis direction, as illustrated in FIG. 3.

The coil L1 in the LC parallel resonator LC1 and the coil L2 in the LC parallel resonator LC2 are electromagnetic-field-coupled to each other. Accordingly, when the high-frequency signal Sig1 flows in the LC parallel resonator LC1 in a clockwise fashion in a planar view from the positive direction side in the x-axis direction, a high-frequency signal Sig2 flows, due to electromagnetic induction, in the LC parallel resonator LC2 in an anticlockwise fashion in a planar view from the positive direction side in the x-axis direction.

The LC parallel resonator LC2 and the LC parallel resonator LC3 are electromagnetic-field-coupled to each other. Accordingly, when the high-frequency signal Sig2 flows in the LC parallel resonator LC2 in an anticlockwise fashion in a planar view from the positive direction side in the x-axis direction, a high-frequency signal Sig3 flows, due to electromagnetic induction, in the LC parallel resonator LC3 in a clockwise fashion in a planar view from the positive direction side in the x-axis direction. Accordingly, the high-frequency signal Sig3 is output from the outer electrode 14b.

Here, the LC parallel resonators LC1 to LC3 have natural resonant frequencies defined on the basis of the coils L1 to L3 and the capacitors C1 to C3, respectively. In addition, the impedances of the LC parallel resonators LC1 to LC3 become high at these resonant frequencies. Accordingly, the high-frequency signal Sig3 having a predetermined frequency band defined on the basis of these resonant frequencies is output from the outer electrode 14b.

Next, a non-limiting example of a manufacturing method for the electronic component 10 will be described with reference to FIG. 1 and FIG. 2.

First, ceramic green sheets to be the insulator layers are prepared. Next, the via hole conductors b1 to b27 are formed in each of the ceramic green sheets to be the insulator layers 16b to 16f. Specifically, the ceramic green sheets to be the insulator layers 16b to 16f are irradiated with a laser beam, and the via holes are formed. Next, using a method such as printing or applying, the via holes are filled with a conductive paste such as Ag, Pd, Cu, Au, or the alloy thereof.

Next, using a method such as a screen printing method or a photolithographic method, a conductive paste whose main component is Ag, Pd, Cu, Au, or the alloy thereof, for example, is applied on the ceramic green sheets to be the insulator layers 16b, 16f, and 16g, and hence, the extraction conductor layers 20a and 20b, the capacitor conductor layers 22a to 22c, the coil conductor layers 24a to 24c, the ground conductor layer 26, and the extraction conductor layers 28a and 28b are formed. In addition, at the time of the formation of the extraction conductor layers 20a and 20b, the capacitor conductor layers 22a and 22b, and the coil conductor layers 24a to 24c, the via holes may also be filled with a conductive paste.

Next, individual ceramic green sheets are laminated. Specifically, a ceramic green sheet to be the insulator layer 16g is disposed. Next, a ceramic green sheet to be the insulator layer 16f is disposed on the ceramic green sheet to be the insulator layer 16g. After that, the ceramic green sheet to be the insulator layer 16f is pressure-bonded to the ceramic green sheet to be the insulator layer 16g. After that, in the same way, ceramic green sheets to be 16e, 16d, 16c, 16b, and 16a are also subjected to lamination and pressure bonding in this order. As a result of the above-mentioned process, a mother laminated body is formed. Using an isostatic press or the like, the mother laminated body is subjected to main pressure bonding.

Next, using a cutting blade, the mother laminated body is cut into the laminated body 12 having a predetermined dimension. A binder removal process and firing are performed on this unfired laminated body 12.

As a result of the above-mentioned process, the fired laminated body 12 is obtained. The laminated body 12 is subjected to barrel processing and chamfered. After that, using to a method such as, for example, a dipping method, an electrode paste whose main component is silver is applied to and burned into the surface of the laminated body 12, and hence, a silver electrode to be the outer electrode 14 is formed.

Finally, Ni plating or Sn plating is performed on the surface of the silver electrode, and hence, the outer electrode is formed. Through the above-mentioned process, the electronic component 10 illustrated in FIG. 1 is completed.

According to the electronic component 10 configured in such a way as described above, it is possible to decrease the degrees of coupling between the coils L1 to L3 without an element growing in size. Hereinafter, the electronic component and an electronic component according to a comparative example where loop planes S1 to S3 are parallel to one another will be described and compared with each other. Distances between the loop planes S1 and S3 and the loop plane S2 in the electronic component according to the comparative example are equal to the distances between the loop planes S1 and S3 and the loop plane S2 in the end portions on the positive direction side in the y-axis direction in the electronic component 10.

In the electronic component according to the comparative example, since the loop planes S1 to S3 are parallel to one another, a magnetic flux occurring from the loop plane S2 in a normal direction passes through the loop planes S1 and S3. On the other hand, in the electronic component 10, the loop planes S1 and S3 are inclined with respect to the loop plane S2. Therefore, in the electronic component 10, in a planar view in the x-axis direction, the loop plane S2 spreads out of the loop planes S1 and S3 to the negative direction side in the y-axis direction. Accordingly, in the electronic component 10, a portion of the magnetic flux occurring from the loop plane S2 in the normal direction does not pass through the loop planes S1 and S3. In this way, in the electronic component 10, a magnetic flux to pass through the loop planes S1 and S3 in the electronic component according to the comparative example turns out not to pass through the loop planes S1 and S3. Therefore, the degrees of coupling between the coils L1 to L3 in the electronic component 10 become lower than the degrees of coupling between the coils L1 to L3 in the electronic component where the loop planes S1 to S3 are parallel to one another.

In this regard, however, as described above, distances between the loop planes S1 and S3 and the loop plane S2 in the electronic component according to the comparative example are equal to distances between the loop planes S1 and S3 and the loop plane S2 in the end portions on the positive direction side in the y-axis direction in the electronic component 10. Accordingly, the chip size of the electronic component 10 is equal to the chip size of the electronic component according to the comparative example. As described above, in the electronic component 10, it is possible to decrease the degrees of coupling between the coils L1 to L3 without an element growing in size.

Figure 4:
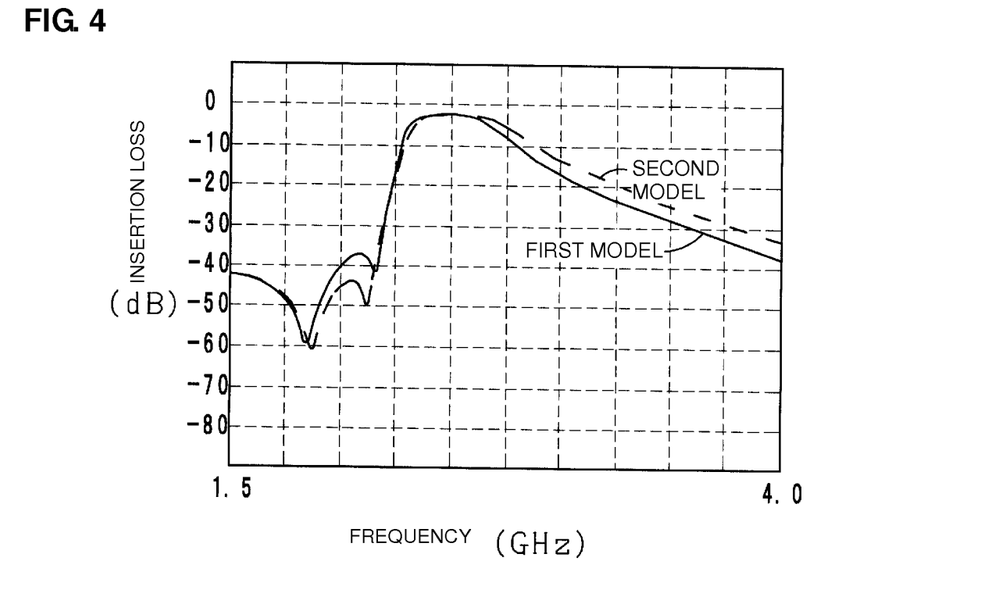
FIG. 4 is a graph illustrating a simulation result.

For the sake of further clarifying and confirming the advantageous effects achieved by the electronic component 10, the inventor of the present application performed computer simulation to be described hereinafter. Specifically, the model (first model) of the electronic component 10 and the model (second model) of the electronic component according to the comparative example were created, and the transmission characteristics of these were studied. FIG. 4 is a graph illustrating a simulation result. A vertical axis indicates an insertion loss, and a horizontal axis indicates a frequency.

According to FIG. 4, it can be seen that the pass band of the first model is narrower than that of the second model. Here, it has been known that a pass band becomes narrow when the degrees of coupling between the coils L1 to L3 are decreased in a band pass filter. Therefore, according to the present simulation, it is clear that the degrees of coupling between the coils L1 to L3 in the first model become lower than in the second model.

Figure 5A:
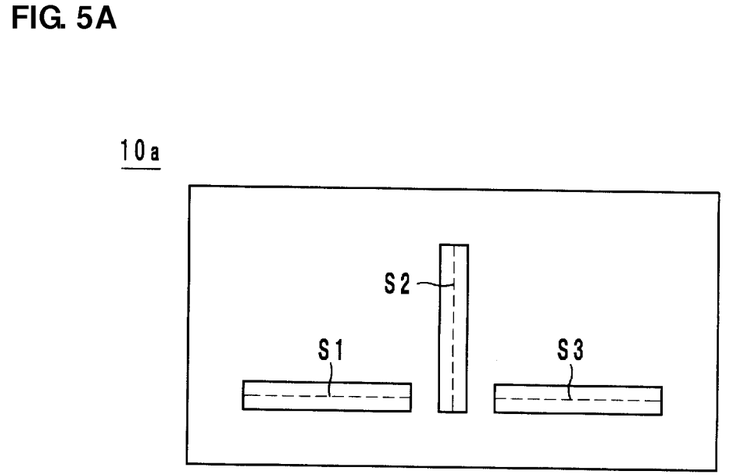
FIG. 5A is a diagram when an electronic component according to a first example of a modification of a preferred embodiment of the present invention is seen through from a positive direction side in a z-axis direction.
Figure 5B:
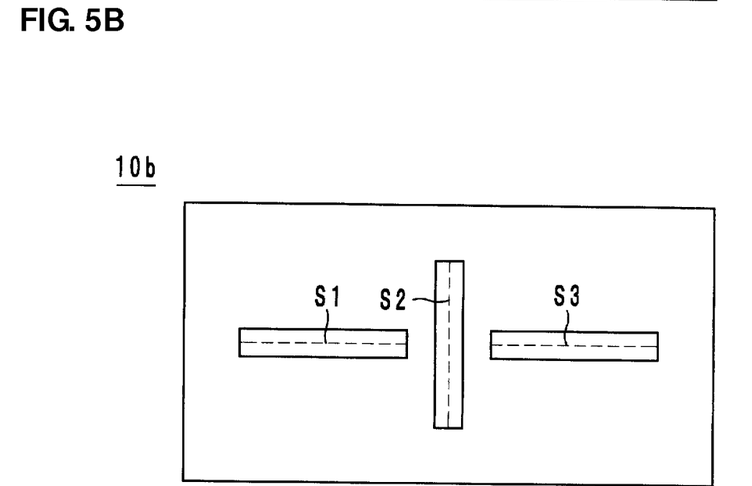
FIG. 5B is a diagram when an electronic component according to a second example of a modification of a preferred embodiment of the present invention is seen through from a positive direction side in a z-axis direction.

Hereinafter, an electronic component according to an example of a modification of a preferred embodiment of the present invention will be described with reference to drawings. FIG. 5A is a diagram when an electronic component according to a first example of a modification of a preferred embodiment of the present invention is seen through from the positive direction side in the z-axis direction. FIG. 5B is a diagram when an electronic component according to a second example of a modification of a preferred embodiment of the present invention is seen through from the positive direction side in the z-axis direction.

As illustrated in FIG. 5A, in an electronic component 10a, in a planar view in the z-axis direction, the loop planes S1 and S3 and the loop plane S2 may also form right angles with each other. Accordingly, in a planar view in the x-axis direction, an area becomes large where the loop plane S2 spreads out of the loop planes S1 and S3 to the negative direction side in the y-axis direction. As a result, the degrees of coupling between the coils L1 to L3 in the electronic component 10a become even lower.

In addition, as illustrated in FIG. 5B, in an electronic component 10b, in a planar view in the z-axis direction, one end of the loop plane S1 and one end of the loop plane S3 may also be nearest to the loop plane S2 in the middle point of the loop plane S2. Accordingly, the loop plane S1 and the loop plane S3 are separated from each other due to the loop plane S2. As a result, it becomes difficult for the LC parallel resonator LC1 and the LC parallel resonator LC3 to be electromagnetic-field-coupled to each other. As a result, the degrees of coupling between the coils L1 to L3 in the electronic component 10b become even lower.

As described above, preferred embodiments of the present invention and the modifications thereof are useful for an electronic component, and in particular, superior in terms of being capable of decreasing the degree of coupling between LC parallel resonators without an element growing in size.

While preferred embodiments of the present invention and modifications thereof have been described above, it is to be understood that variations and additional modifications will be apparent to those skilled in the art without departing from the scope and spirit of the present invention. The scope of the present invention, therefore, is to be determined solely by the following claims.

What is claimed is:

1. An electronic component comprising:
    a laminated body including a plurality of insulator layers laminated on each other in a lamination direction; and
    a first LC parallel resonator and a second LC parallel resonator that are loop-shaped LC parallel resonators each including via hole conductors extending in the lamination direction and a conductor layers provided on one of the plurality of insulator layers so as to define a band pass filter; wherein
    a first loop plane of the first LC parallel resonator and a second loop plane of the second LC parallel resonator are parallel to the lamination direction and not parallel to each other;
    each of the first and second LC parallel resonators includes two of the via hole conductors that are disposed at opposite ends of the conductor layer of a respective one of the first and second LC parallel resonators;
    the first loop plane intersects both of the two via hole conductors disposed at the opposite ends of the conductor layer of the first LC parallel resonator and all portions of the conductor layer of the first LC parallel resonator;
    the second loop plane intersects both of the two via hole conductors disposed at the opposite ends of the conductor layer of the second LC parallel resonator and all portions of the conductor layer of the second LC parallel resonator.

2. The electronic component according to claim 1, wherein the laminated body has a rectangular or substantially rectangular parallelepiped shape; and
    the second loop plane is parallel to a side of the laminated body in a planar view in the lamination direction.

3. The electronic component according to claim 1, wherein the first loop plane and the second loop plane define a right angle with each other.

4. The electronic component according to claim 1, further comprising:
a third LC parallel resonator that is a loop-shaped LC parallel resonator including via hole conductors extending in the lamination direction and a conductor layer provided on at least one of the insulator layers so as to define the band pass filter in association with the first LC parallel resonator and the second LC parallel resonator; wherein
a third loop plane of the third LC parallel resonator is parallel to the lamination direction; and
the first loop plane and the third loop plane sandwich therebetween the second loop plane.

5. The electronic component according to claim 4, wherein the second loop plane and the third loop plane are not parallel to each other.

6. The electronic component according to claim 5, wherein in a planar view in the lamination direction, one end of the first loop plane and one end of the third loop plane are nearest to the second loop plane in a middle point of the second loop plane.

7. The electronic component according to claim 4, wherein the third LC parallel resonator includes a coil and a capacitor.

8. The electronic component according to claim 7, wherein the capacitor includes a capacitor conductor layer and a ground conductor layer.

9. The electronic component according to claim 8, wherein each of the capacitor conductor layer and the ground conductor layer has a rectangular or substantially rectangular shape.

10. The electronic component according to claim 7, wherein the coil includes the via hole conductors and a coil conductor layer.

11. The electronic component according to claim 7, wherein the coil has a U-shaped or substantially U-shaped configuration.

12. The electronic component according to claim 1, wherein
the first LC parallel resonator includes a coil and a capacitor;
the capacitor includes:
a ground conductor layer defined by the conductor layer provided on a lowest side of the first LC parallel resonator in the lamination direction; and
a capacitor conductor layer defined by the conductor layer facing the ground conductor layer through one of the insulator layers; and
the coil includes:
a first coil via hole conductor connected to the capacitor conductor layer and defined by one of the via hole conductors extending in the lamination direction;
a second coil via hole conductor connected to the ground conductor layer and defined by another one of the via hole conductors extending in the lamination direction; and
a coil conductor layer defined by the conductor layer connected to an end portion of the first coil via hole conductor, located on an upper side in the lamination direction, and an end portion of the second coil via hole conductor, located on an upper side in the lamination direction.

13. The electronic component according to claim 1, further comprising a plurality of external electrodes provided on the laminated body and defining input electrodes, output electrodes and ground electrodes.

14. The electronic component according to claim 1, wherein the plurality of insulating layers are rectangular or substantially rectangular.

15. The electronic component according to claim 1, wherein each of the first and second LC parallel resonators includes a coil and a capacitor.

16. The electronic component according to claim 15, wherein the capacitor of each of the first and second LC parallel resonators includes a capacitor conductor layer and a ground conductor layer.

17. The electronic component according to claim 16, wherein each of the capacitor conductor layer and the ground conductor layer has a rectangular or substantially rectangular shape.

18. The electronic component according to claim 15, wherein the coil of each of the first and second LC parallel resonators includes the via hole conductors and a coil conductor layer.

19. The electronic component according to claim 15, wherein the coil of each of the first and second LC parallel resonators has a U-shaped or substantially U-shaped configuration.

20. The electronic component according to claim 15, wherein each of the first loop plane and the second loop plane has a rectangular or substantially rectangular shape.

21. The electronic component according to claim 1, wherein
the laminated body includes first and second short sides that are opposed to each other and first and second long sides that are opposed to each other and longer than the first and second short sides; and
a distance between one of the two via hole conductors of the first LC parallel resonator and one of the first and second short sides is different from a distance between the other of the two via hole conductors of the first LC parallel resonator and the one of the first and second short sides.

22. The electronic component according to claim 1, wherein
the laminated body includes first and second short sides that are opposed to each other and first and second long sides that are opposed to each other and longer than the first and second short sides; and
the conductor layer of the second LC parallel resonator has a line shape extending parallel or substantially parallel to at least one of the first and second short sides.

* * * * *